United States Patent
Bosshart

(10) Patent No.: US 7,709,301 B2
(45) Date of Patent: May 4, 2010

(54) INTEGRATED CIRCUIT HAVING EFFICIENTLY PACKED DECOUPLING CAPACITORS

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 108 days.

(21) Appl. No.: 12/108,191

(22) Filed: Apr. 23, 2008

(65) Prior Publication Data

US 2009/0267124 A1    Oct. 29, 2009

(51) Int. Cl.
*H01L 21/82* (2006.01)
*H01L 27/10* (2006.01)

(52) U.S. Cl. .................... 438/129; 257/208
(58) Field of Classification Search ......... 257/206–210, 257/202, 499, E27.046–E27.124; 438/128–129
See application file for complete search history.

(56) References Cited

U.S. PATENT DOCUMENTS 7,137,092 B2 * 11/2006 Maeda ..................... 716/8

2009/0108360 A1 * 4/2009 Smayling et al. ............ 257/368

* cited by examiner

*Primary Examiner*—Calvin Lee
(74) *Attorney, Agent, or Firm*—Dawn V. Stephens; Wade J. Brady, III; Frederick J. Telecky, Jr.

(57) ABSTRACT

An integrated circuit includes a substrate having a semiconducting surface (605) and a plurality of standard cells arranged in a plurality of rows including at least a first row (610) and a second row (615) immediately above the first row. The first row (610) include at least a first decap filler cell (602) including a first active area (612) and a field dielectric outside the first active area (612) having a portion with a full field dielectric thickness portion 621and a portion with a thinned field dielectric (622), and at least a first MOS transistor (618) having a gate electrode (619) on a thick gate dielectric (613) on the first active area (612) connected as a decoupling capacitor. The second row (615) includes a second decap filler cell (601) including an active area (632) and a field dielectric portion (621) and thinned field dielectric portion (622), at least a second MOS transistor (638) having a gate electrode (639) on the thick gate dielectric (613) on the second active area (632) connected as a decoupling capacitor. The thinned field dielectric (622) extends from the first decap filler cell (602) to the second decap filler cell (601) across a border (608) between the first and second decap filler cell. A method of forming an integrated circuit including high efficiency decap filler cells includes the step of gap filling a thick gate dielectric mask.

10 Claims, 4 Drawing Sheets

US 7,709,301 B2

INTEGRATED CIRCUIT HAVING EFFICIENTLY PACKED DECOUPLING CAPACITORS

TECHNICAL FIELD OF THE INVENTION

The present invention relates generally to integrated circuits having on-chip decoupling capacitors.

BACKGROUND

In general, the high clock frequencies of modern integrated circuits (ICs) typically result in the supply current changing at speeds exceeding the ability of typical off-chip power supplies. As a result, on-chip power supply decoupling capacitance structures are typically provided to more quickly respond to changing power supply requirements demanded by the IC. With ICs generally operating at higher speeds, lower voltages and higher current levels, the demand for on-chip decoupling capacitance (decap) structures has generally increased, requiring a higher capacitance per unit area on the IC.

Many IC's are now designed using cell libraries. That is, the IC can be designed using circuit elements laid out in individual cells having at least one fixed dimension, such as a fixed height. The cells are then typically placed in a plurality of rows and interconnected by metal interconnect structures of the IC to provide the desired functionality. Such cell libraries typically include cells for many types of circuit elements, including decap cells. These decap cells are generally placed after the other portions of the integrated circuit are placed. Therefore, typical cell-based layouts include decap cells filling as much as possible of the remaining empty portions of the IC remaining after placement of the cells and interconnect structures providing the IC's functionality in order to provide as much capacitance as possible. Consequently, a large fraction of the typical cell-based IC is generally filled with decap cells, with the remaining unused space generally filled with conventional testing filler cells.

In metal-insulator-semiconductor (MIS) designs, decap cells generally comprise transistors having their gate connected to one power supply line (e.g. Vss or ground) and the source/drain and body connected to one other power supply line (e.g. Vdd). The capacitance provided in such decap cells is based on the area of the gate electrode over active area. These transistors generally have a thicker gate dielectric, referred to herein as TGOX (e.g., that of high voltage transistors, such as I/O transistors) than that of other standard cells in the IC, referred to herein as THINOX (having logic gates or memory) to minimize leakage current through the gate dielectric. For example, in a typical IC process using silicon dioxide comprising gate dielectrics, the thickness of the gate oxide used for the decap gate dielectric is generally about double or triple the thickness of gate oxide for standard transistor comprising cells.

The mask layout of a typical standard cell-based decap filler cell 100 is shown in FIG. 1. Nwell 114, cell border region 112, and PMOS transistors 102a and 102b within Nwell 114. Cell border 112 is shown. As well known in the art, although not corresponding to a particular physical structure, cell border 112 is a boundary between two adjacent standard cells that would be recognizable by one having ordinary skill in the art, such as the midpoint between the periphery device portions of two adjacent cells.

PMOS transistors 102a and 102b include gate electrodes 110a and 110b and associated P+ diffusion layer 106. Diffusion/active layer 106 is coupled to Vdd by layer 117 over contacts 104a, 104b, 104c, while gate electrodes 110a and 110b are coupled to Vss by layer 118 over gate contacts 105a and 105b. Regions outside diffusion/active layer 106 including border region are inactive, generally thick dielectric regions, such as comprising shallow trench isolation (STI) oxide.

A shown in FIG. 1, a decap gate dielectric mask 108 generally surrounds the transistors 102a, 102b in the layout of decap cell 100. The mask edge of decap gate dielectric 108 generally requires sufficient overlap shown as "ds" to the mask edge of the active portion of gate electrodes 110a, 110b (defined by diffusion/active layer 106), and sufficient spacing shown as "de" to the cell border 112 so that cell 100 has adequate spacing to any device that can appear in an adjacent cell, such as thin dielectric based standard cells (e.g. including logic devices or memory devices). Although only 2 transistor-based capacitor structures 102a and 102b are shown in the decap cell 100, and both are PMOS, any number of transistors can be used in the layout, NMOS based decaps can be used, and in one embodiment the decap cell can include both PMOS and NMOS-based decaps.

In decap cells, efficiency is generally defined as the fraction of the cell area which provides capacitance. It is generally desirable for the decap cells in an IC design to have as high efficiency as possible. The efficiency in a typical decap cell, such as cell 100, is generally influenced by three factors. First, when the cell is large in the x dimension, multiple transistors 102a, 102b are laid out to avoid the long time constants associated with a single large transistor. Although, such a design requires additional decap cell area to be spent for the additional source/drain contacts 104a, 104b, 104c required in the layout and represents lost efficiency, this lost efficiency being generally minor in view of other effects. Second, there is usually a density limit on the diffusion/active layer 106. In particular, the diffusion/active layer 106 cannot generally occupy more than a certain percentage of the area in large regions, depending on the process technology. This limitation results in reduced decap cell efficiency that is generally difficult to recover by optimizing the amount of area designed for the diffusion/active layer 106.

The final efficiency reducing factor results from the required decap gate dielectric mask overlap (ds) and spacing to the cell edge (de) described above. The decap gate dielectric mask 108 being spaced a significant distance within border 112 of the cell 100 results in the active edge of gate electrode mask being a large distance within the border region 112 of the cell 100, limiting cell capacitance and this cell efficiency.

Design rules require large overlap (ds) and spacing (de) because conventional standard cell layout techniques assume that each standard cell in a cell-based design is a single, separate entity and can be any available device. Furthermore, it is generally desirable to keep mask costs are low for forming the decap cell 100 by using large feature sizes and spacing, in particular for the decap gate dielectric mask 108. Therefore, conventional layout methodologies and the design rules for decap filler cells continue to generally do not utilize large areas around the periphery of the cell 100 for capacitance.

For example, as shown in FIG. 2, the decap gate dielectric mask which defines TGOX regions 208, 210, and 216, in decap cells 202, 204, and 214, respectively, is shown placed adjacent to a standard cell 206 that includes THINOX region 212 defined by a THINOX mask. A single transistor 219 is shown associated with THINOX region 212, although standard cell 206 generally includes a plurality of logic or memory devices. Design rules require the THINOX mask edge defining region 212 to be at least a minimum distance from the thick dielectric mask edge in cells 202, 210 and 214 shown as min $d_{THINOX}$. In a MOS-based design using both TGOX and THINOX layers, the TGOX design rules result in a minimum TGOX to TGOX spacing between the TGOX 208 mask edge in the bottom row and TGOX 210 mask edge in the upper row (shown as $d_{TGOX}$ in FIG. 2 which is 2 times 'de' shown in FIG. 1). Similarly, the design rules generally provide a minimum TGOX to THINOX mask edge spacing ($d_{THINOX}$) between the TGOX mask portions 208, 210 and THINOX mask region 212 in standard cell 206.

Furthermore, the loss in efficiency generally worsens as design rules for other layers are further scaled without scaling design rules decap gate dielectrics. Therefore, what is needed is a standard cell-based methodology and resulting integrated circuits which improve the efficiency for decap filler cells.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit includes a substrate having a semiconducting surface and a plurality of standard cells arranged in a plurality of rows including at least a first row and a second row immediately above the first row. The first row include at least a first decap filler cell including a first active area and a field dielectric outside the first active area having a portion with a fall field dielectric thickness portion and a portion with a thinned field dielectric, and at least a first MOS transistor having a gate electrode on a thick gate dielectric on the first active area connected as a decoupling capacitor. The second row includes a second decap filler cell including an active area and a field dielectric portion and thinned field dielectric portion, at least a second MOS transistor having a gate electrode on the thick gate dielectric on the second active area connected as a decoupling capacitor. The thinned field dielectric extends from the first decap filler cell to the second decap filler cell across a border between the first and second decap filler cell. A method of forming an integrated circuit including high efficiency decap filler cells includes the step of gap filling a thick gate dielectric mask.

DETAILED DESCRIPTION OF THE DRAWINGS

Figure 1A:
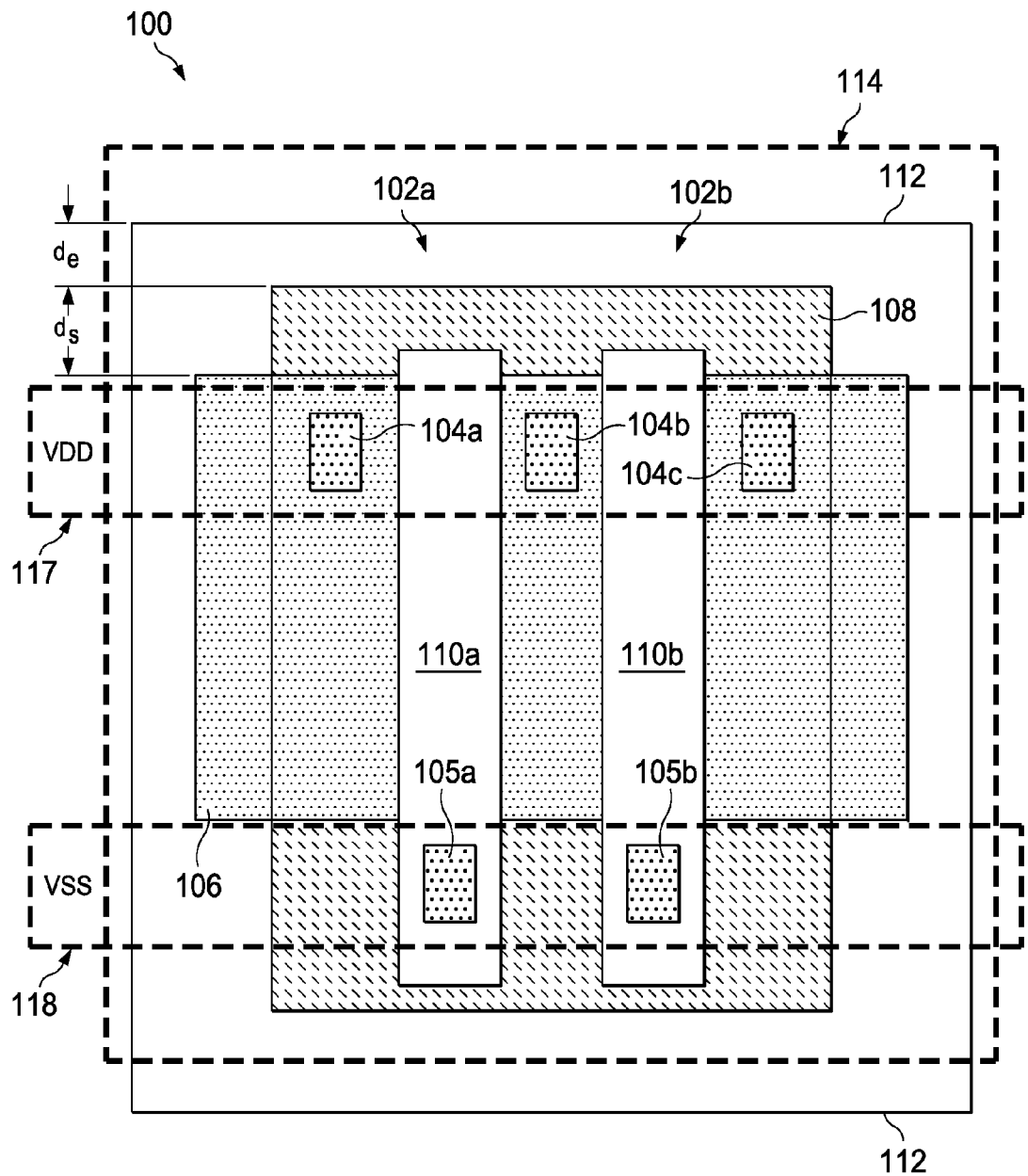
FIG. 1 is an exemplary layout schematic of a known standard decoupling capacitor cell.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, can recognize that the invention can be practiced without one or more of the specific details or with other methods. In other instances, well-known structures or operations are not shown in detail to avoid obscuring the invention. The present invention is not limited by the illustrated ordering of acts or events, as some acts can occur in different orders and/or concurrently with other acts or events. Furthermore, not all illustrated acts or events are required to implement a methodology in accordance with the present invention.

Embodiments of the present invention provide a layout methodology and resulting structures having significantly improved efficiency of decap cells for standard cell library designs. As previously described, design rules for standard cells in a cell library require cells to each be self-contained. This means all masks edges must terminate within the cell border. Significantly, embodiments of the present invention do not obey the conventional self contained design rule. As a result, decap filler efficiency for decap filler cells according to embodiments of the invention is significantly improved, particularly the top and bottom of the cell around the cell border.

In general, standard cell libraries can include any number of cells formed using any group of transistors, interconnect structures or other circuit elements, and can be designed to perform any number of analog and/or digital functions. For example, along with decap cells, a cell library can also include standard cell designs that provide any combination of boolean logic functions (e.g., AND, NAND, OR, NOR, XOR, XNOR, inverters), different types of storage functions (e.g., memory, flip-flop or latch), signal processing functions (e.g., amplifiers or filters), or any combination thereof. One of ordinary skill in the art will readily recognize that a standard cell library can also include other standard cells to provide additional functions not listed above, depending on the type of cell library and the process technology associated with the standard cell library.

It will be assumed in the description below that the standard-cell based circuit design is supported by a process that includes transistors having a thick gate dielectric (referred to herein as TGOX) and transistors having a thin gate dielectric (THINOX). However, the gate dielectrics may be any dielectric, including both oxide and non-oxide (e.g. high k) dielectrics.

Regarding the method, decap filler cells with increased efficiency can be created by first beginning with a conventional standard cell layout having standard cell gates and placing decap fillers in some or all locations unused by standard cell gates based on conventional design rules. As described above relative to FIG. 1, conventional design rules require the TGOX mask to have a minimum overlap (ds) to the active gate electrode (e.g. poly) mask edge and minimum TGOX mask edge spacing (de) to the cell border. The TGOX mask geometry is then expanded towards the top and bottom of the cell thus initially violating the TGOX spacing rule (distance 'de' in FIG. 1), and in one embodiment the TGOX expansion continues until it just satisfies the design rules for TGOX spacing to adjacent standard cells' THINOX mask edge. Illegal corner overlaps that can develop between decap filler cells due to the expansion can be eliminated by reducing cell sizes and/or moving cells. Gap fill as described below on the TGOX mask layer is then performed to eliminate the TGOX spacing violations between neighboring cells created by the expansion.

Methods according to the invention are generally made during the layout process and after completion of the layout are generally reflected in mask sets. The Inventor has found that decap cell and gap fill placement according using the invention described herein can provide 53% more decap capacitance per unit area in standard cell based IC's using standard 45 nm technology cell libraries compared to conventional standard cell based IC's before the present invention.

Overlaps, as used herein, describe any overlap between portions of the decap gate dielectric mask for different decap cells in different rows, in either the X or Y direction. For example, referring again to FIG. 2, decap TGOX mask portions 210 and 208 show an overlap in the X direction. Similarly, TGOX mask portions 210 and 216 overlap in the Y direction.

Figure 2:
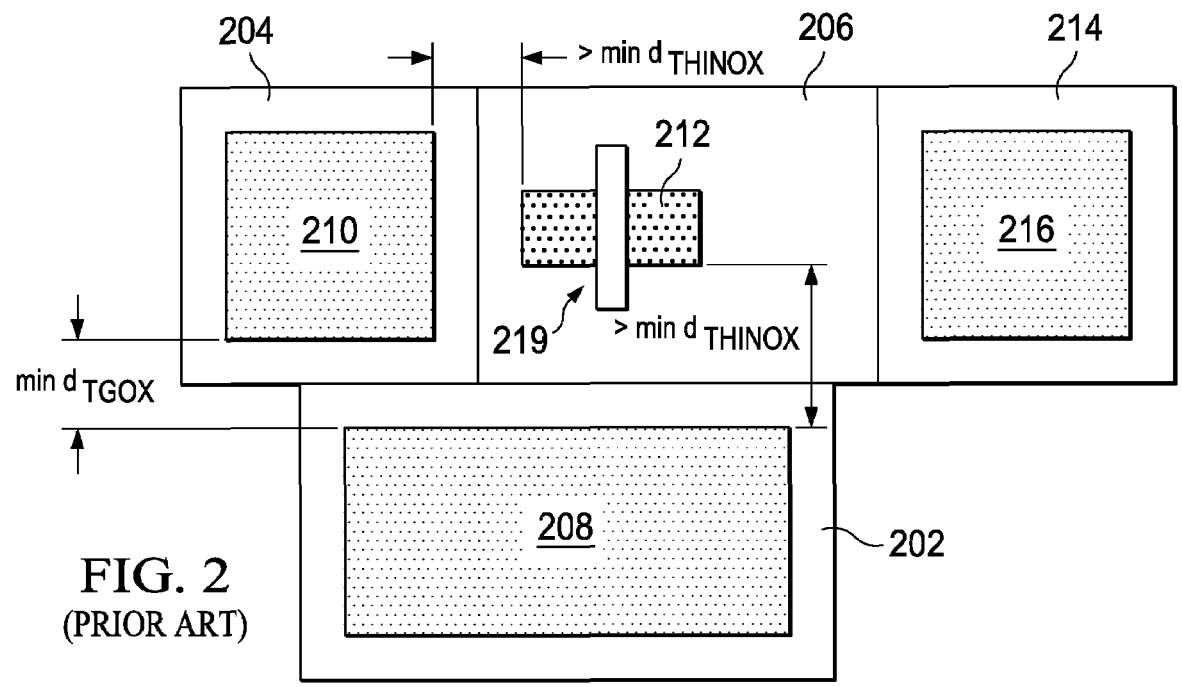
FIG. 2 is an illustration of a layout aspect of known layout arrangement for standard decoupling capacitor cells.
Figure 3:
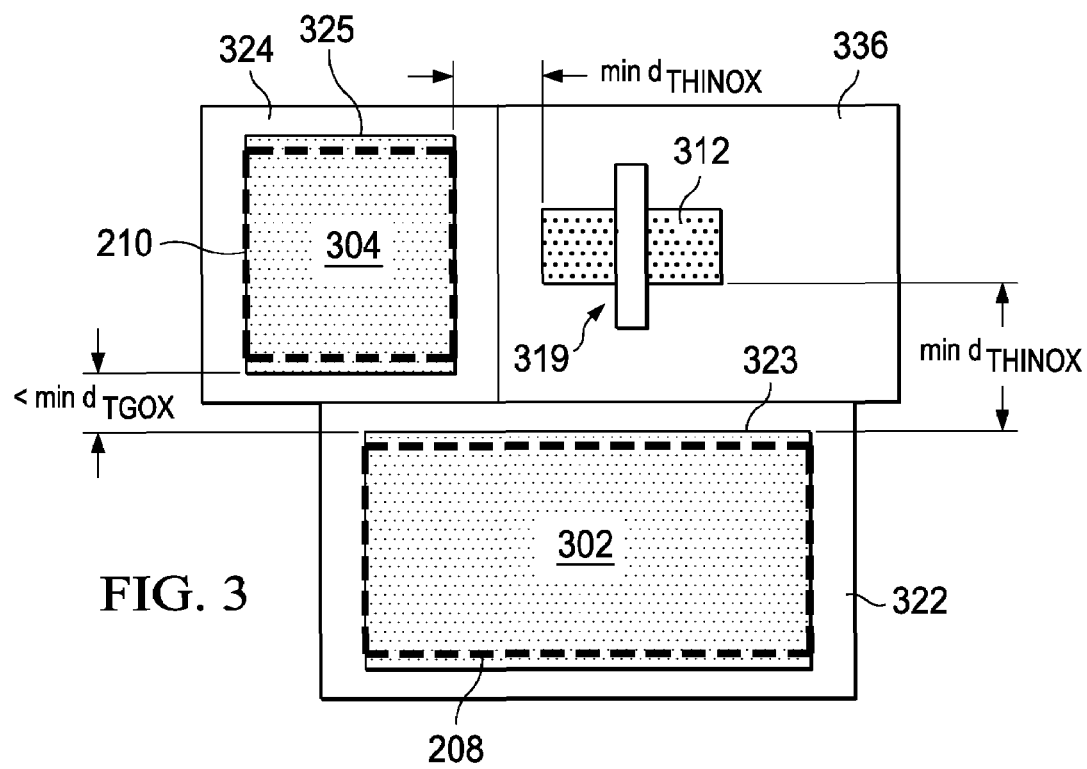
FIG. 3 is an illustration of a first layout aspect for decap filler cells comprising a TGOX expansion, according to embodiments of the present invention.

FIG. 3 is an illustration of a first layout aspect for standard cell-based decoupling capacitors according to embodiments of the present invention which shows the TGOX mask geometry for decap filler cells 322 and 324 expanded towards the top and bottom of the cell thus violating the conventional TGOX minimum spacing design rule ($d_{TGOX}$ in FIG. 2), continued until it just satisfies the design rules for TGOX spacing to an edge of THINOX mask 312 in adjacent standard cell 336 ($D_{THINOX}$ shown in FIG. 2). Expanded top edge of cell 322 is shown as 323, while expanded bottom of cell 324 is shown as 325. Transistor 319 is within cell 336. In practice, and generally assumed herein, the $d_{TGOX}$ limitation would be generally encountered before the $d_{THINOX}$ limitation. TGOX mask regions 208, 210 are shown with dashed lines inside expanded TGOX regions 302 and 304. The dashed lines evidence the TGOX mask expansions both upwards and downwards. The extended TGOX mask edge 302, 304 for their associated decap cells thus become separated by a spacing less than the minimum $d_{TGOX}$ spacing, in violation of conventional TGOX design rules. This TGOX mask expansion is generally selective, i.e., non decap standard cells defined by the TGOX mask (e.g. high voltage transistors in I/O cells) generally retain the stricter TGOX to TGOX design rule.

Figure 4:
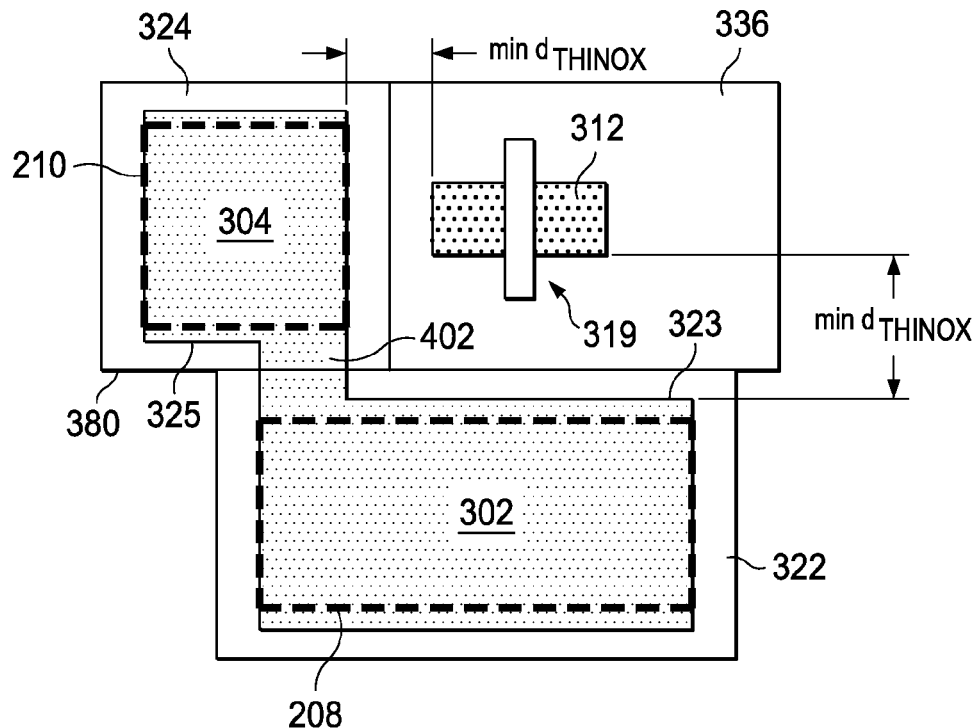
FIG. 4 is an illustration of a second layout aspect for standard cell-based decoupling capacitors according to embodiments of the invention which comprises gap filling to eliminate design rule violations created by TGOX expansion, according to embodiments of the invention.

FIG. 4 is an illustration of a second layout aspect for standard cell-based decoupling capacitors according to embodiments of the present invention which comprises gap filling of TGOX mask portions to eliminate design rule violations associated with TGOX-TGOX spacing between adjacent standard cells resulting from cell expansions. Two exemplary gap fill methods are described below.

In a first exemplary gap filling method, involving incrementing, merging, then decrementing, the extended TGOX mask portions in adjacent decap filler cells can be further extended concurrently, by incrementing in size by just under half the TGOX design rule spacing. As a result, extended top edge 323 shown in FIG. 3 is extended upward and extended bottom edge 325 shown in FIG. 3 is extended downward until their overlapping portions touch, such as at the cell border. Any resulting adjacent TGOX mask features with sub-minimum TGOX spacings or that are touching or overlapping can then be merged to eliminate the respective TGOX mask boundaries in the touching or overlapping regions. FIG. 4 shows extended TGOX mask portions 302, 304 after being merged and decremented. The filled TGOX mask portion is shown as 402, comprising a portion above and below the cell border. As a result of the merger, a single TGOX mask portion comprising portions 302, 304 and 402 is created. Note this single TGOX mask portion provides a TGOX mask pattern for cells 322 and 324 across their common cell border 380. The merger eliminates the TGOX violation. By decrementing the KGOX layer in size the same amount it was incremented returns the upper and lower TGOX cell portions to be as shown in FIG. 4 returned to the same incremented edge positions 325 and 323 respectively shown in FIG. 3, to again provide the minimum design rule $d_{THINOX}$ spacing. The overall incrementing, merging, then decrementing results in TGOX geometries which do not have sub-minimum spacings to other TGOX geometries remaining unchanged, whereas sub-minimum TGOX spacings get filled and result in TGOX patterns such as shown in FIG. 4.

A second and generally computationally simpler exemplary gap filling method compared to the first method assumes the only TGOX geometries which need gap fill are the ones in the decap filler cells. The TGOX geometries are taken from the decap filler cells, and they can be sorted into rows and each row sorted, such as in ascending (or descending) X dimension. Then walking along two adjacent rows, the TGOX mask overlap region in the X dimension between adjacent row TGOX geometries can be found, and additional TGOX filler rectangle can be added in this X overlap region in the Y gap between the two adjacent rows. The result of adding the TGOX filler rectangle is a single TGOX mask portion that provides a TGOX mask pattern for cells 322 and 324 across their common cell border 380, analogous to the structure shown in FIG. 4. In practice, the second exemplary method could be done by just analyzing the decap filler cell placements, knowing how far TGOX is spaced inside the cell's horizontal and vertical edges.

Gap filing may not be able to fix all violations that result from TGOX expansion according to the invention. In one example, referred to as the "insufficient overlap case" a TGOX width violation can be created by the gap fill when the X overlap between the adjacent row TGOX geometries is less than the TGOX design rule width. When cells overlap, they generally must overlap by min-legal-overlap, the amount which creates a gap fill rectangle meeting the TGOX design rule width. In a second example, referred to herein as the "no overlap case", gap fill is not even possible and a TGOX spacing violation can exist in the case there is no overlap in the X direction, and the X spacing between adjacent TGOX geometries is less than the required minimum to satisfy the design rule spacing. Two decap filler cells must be separated in X by at least min-legal-spacing in order to meet the TGOX spacing rule. The TGOX spacing rule can be a diagonal distance or a Manhattan distance. Either requires a certain X spacing between the TGOX geometry corners. Note that because of the decap filler cells' overlap of TGOX, the required min-spacing between the cells could actually be negative.

Typically in standard cell designs, cell sizes and placements are quantized in the X dimension to a placement grid. Therefore, in some embodiments of the present invention, the standard decap cells can have widths equal to a multiple of the width of the placement grid (PG) ($n \cdot w_{PG}$). In some layouts, $w_{PG}$ can be roughly one metal pitch. For example, a 2-input NAND gate might be 4 to 5 of these placement grids wide. Other cells can have different widths equal to $n \cdot w_{PG}$, where n=1 . . . k. Therefore, when designing decap cells for a cell library, a plurality of filler cells can be created having widths ranging from a minimum width to a maximum width, such that the widths can also be equal to $n \cdot w_{PG}$, where n=1 . . . k.

Therefore, the illegal placement overlap and spacing described above as the "insufficient overlap case" and the "no overlap case" can also be described in units of placement grids, wherein mask overlaps in a certain range are defined to be illegal.

Figure 5:
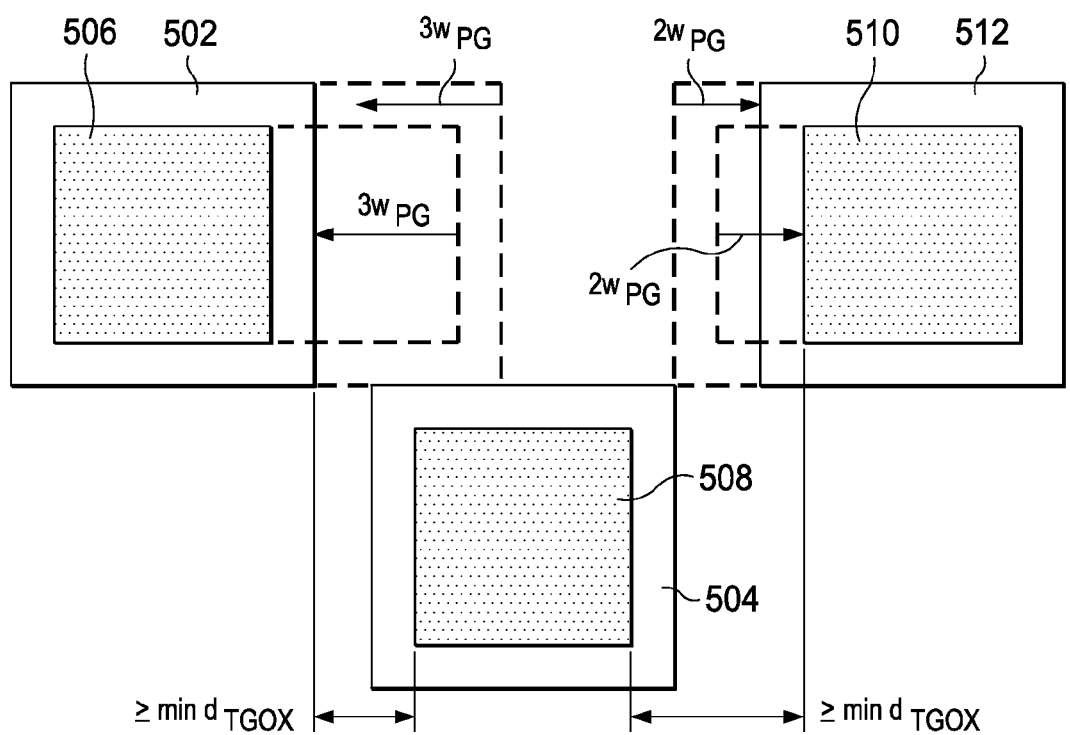
FIG. 5 is an illustration of a methodology to overcome an illegal overlap in the layout comprising reducing the drawn size of at least one of the decap filler cells which cause the violation.

Therefore, in some embodiments of the invention, before decap gate dielectric mask portions are gap filled, a task can performed to eliminate illegal corner overlaps. In such embodiments, each decap cell layout can be examined for illegal overlaps to its neighboring cells. If an illegal overlap is found in the layout, the overlap can be eliminated by reducing the drawn size of at least one of the decap cells which cause the violation. An exemplary embodiment of this methodology is shown in FIG. 5, where in the case of TGOX-based decaps comprising decap cells 502 and 504 having TGOX mask portions 506, 508 at or below a minimum mask overlap are corrected by decreasing the cell size of the decap cell 502 by $3w_{PG}$ (PG=Placement grid), such that the resulting TGOX to TGOX mask edge spacing in X is greater than the minimum TGOX design rule spacing. In other words, the edges of the decap cell 502 and the TGOX mask portion 506 therein are moved by $3w_{PG}$. Similarly, a violation resulting from decap cell 510 having TGOX mask portion 512 having an illegal TGOX corner-to-corner spacing to the TGOX mask portion 508 in decap cell 504 can be overcome by decreasing the width of the decap cell by $2w_{PG}$. In other words, the edges of the decap cell 510 and the TGOX mask portion 512 therein are moved by $2w_{PG}$. Under typical design rules, it is legal to change the size of decap cells. Although such changes result in smaller cells and reduce the total capacitance provided by all the decap cells, this amount is generally small. In some embodiments of the present invention, the actual edges of the cell and the decap gate dielectric mask therein can be moved. In other embodiments of the present invention, the cells can be replaced with a smaller size standard decap cell, as described below.

Methodologies according to embodiments of the invention are not limited to eliminating violations created by expanding by examining decap cells individually. In other embodiments of the invention, violations can be overcome by scanning row edges. That is, an edge between two adjacent rows can be scanned, looking for the mask regions between adjacent standard decap cells having a spacing or overlap of decap gate dielectric mask portions resulting in a corner-to-corner violation. If an illegal overlap or spacing is found, the size of the top cell can be decreased by an amount or by exchanging it with a decap cell $x \cdot w_{PG}$ smaller. The left edge of the top cell can remain in the same place and its right edge can be moved to the left by $x \cdot w_{PG}$. In these embodiments, if the top cell is the one that is moved, and the adjacent row pairs are examined in increasing order of rows, the illegal overlaps can be overcome in one pass and with the previous cell changes being unaffected.

As previously discussed, when decap cells are reduced in size to fix design rule violations, there can be a small capacitance loss. However, in embodiments of the present invention, this impact can be minimized by providing decap cells at every allowable width, in increments of the PG. Alternatively, if all sizes are not provided (for example, decap cells are provided in increments of $2n \times w_{PG}$, where n=1 ... k), embodiments of the present invention provide for using the largest size cell below the target size (i.e., continue reducing the cell size until a cell size is found which exists). In some cases, the illegal corner overlap can require that the size of the decap cell be reduced to a size smaller than the smallest existing decap cell. In such cases, the filler cap cell can be deleted from the layout. In embodiments where the decap cell additions and corrections are done before engineering change order (ECO) cell placement, this vacated spot can get filled with an ECO cell.

In other embodiments of the invention, an NWELL (or PWELL) gap fill can also be performed. Referring to FIG. 1, one embodiment of the invention expands the NWELL mask edge 114 in the decap filler cell downwards inside the decap cell until it just satisfies the NWELL spacing design rule to the NWELL of adjacent decap cells. In such embodiments, improved efficiency can be obtained by expanding the NWELL mask edge 114 farther downwards. The expanded NWELL mask edge 114 still needs to satisfy design rule spacings to standard cells. If NWELL gap fill is performed it can be performed analogous to TGOX gap fill described above. Therefore, in some embodiments of the invention, illegal WELL mask spacing can be merged with the illegal overlap range for the decap gate dielectric mask to create a combined illegal overlap range to indicate where either type of overlap violation occurs.

In yet other embodiments, the decap gate dielectric and/or NWELL mask geometries can also be expanded in the X direction until limited by design rules to standard cells. This can result in a layout having a gap fill between adjacent cells in the same row. However, this gap fill would generally have to be known before the illegal corner overlap removal step occurs, because any gap fill between adjacent cells in the same row removes the facing corners of the adjacent cell geometries, so these are then no longer of concern to the illegal corner overlap removal step.

In still another embodiments, it is also possible to adjust the bottom decap cell layout instead of the top cell layout during a row by row analysis to fix violations. This can result in additional complexity in the process. Similarly, rather than always selecting the top or the bottom cell, the process can be configured to determine which cell can be changed in order to achieve a minimum reduction of capacitance or accomplish some other goal. For example, if one of the cells needs to be reduced by one placement grid to fix a corner-to-corner violation, the next lowest cells for each of the two cells can be compared and the cell that has the smallest incremental change can be selected to fix the violation.

Design methodologies according to the present invention generally result in a resulting final circuit topography pattern that is unique and thus characteristic of design methodologies according to embodiments of the invention. As described above, a common feature of embodiments of the invention is generally a mask for the decap filler cell gate dielectric (e.g. TGOX) having decap filler gate dielectric regions that extend from one decap filler cell to an adjacent decap filler cell (e.g. above or below) across the border between the respective cells. As known in the art of process engineering for integrated circuits, prior to growing or depositing a gate dielectric, the semiconductor surface receives processing that removes all dielectric layers (e.g. pad oxide) from surface of the gate region to enable control of the final gate dielectric thickness, which is clearly needed for MOS threshold voltage control. An overetch is also generally included to ensure complete removal of the dielectric over the gate region (e.g. pad oxide) across the entire wafer(s). In conventional circuit designs, the region outside the diffusion/active region, such as outside the diffusion/active region 106 shown in FIG. 1, comprises a field dielectric generally having a thickness of about 0.4 to 0.7 µm, such as silicon dioxide filled trenches in the case of STI-based isolation schemes.

If the nominal field dielectric thickness is referred to herein as the "full field dielectric thickness", the field dielectric or trench dielectric thickness in areas where the TGOX mask according to embodiments of the invention define features will be reduced by the etch or other removal process which also removes the dielectric layer (e.g. pad oxide) from the surface upon which the gate dielectric will be grown or deposited. Such field regions will be referred to herein as having a "thinned field dielectric thickness" and for adjacent decap filler cells this thinned field dielectric will extend across the border region between adjacent decap filler cells, and in embodiments of the invention extend continuously from one decap filler cell to another decap filler cell across the border.

In the case of a conventional silicon oxide comprising field dielectric, there will generally be a measurable topographical difference between the "full field oxide thickness" and the "thinned field oxide thickness" that reproduces the TGOX mask pattern. The difference in field dielectric thickness is generally at least a hundred angstroms in the case of a silicon dioxide field dielectric. In the known arrangement shown in FIG. 1, thinned field oxide thickness will be confined to the overlap region shown as "ds" to the mask edge of the active portion of gate electrodes 110a, 110b (defined by diffusion/active layer 106), but the spacing region shown as "de" to the border 112 of cell 100 has the full field oxide thickness. In contrast, for embodiments of the invention regions analogous to overlap region shown as "ds" to the mask edge of the active portion of gate electrodes 110a, 110b (defined by diffusion/active layer 106) and regions analogous to the spacing region shown as "de" in FIG. 1 both become thinned field dielectric regions. For example, referring again to FIG. 4, the filled mask portion shown as 402 will result in this region having thinned field oxide thickness, extending from one decap filler cell 324 to an adjacent decap filler cell 322 across the border 380 between the respective cells.

As known in the art, field dielectric thinning amount may be somewhat greater for a deposited oxide (as in STI) as compared to a thermal oxide (LOCOS). Measurable field thinning will be present for conventional substrates as well as SOI substrates where the dielectric is $SiO_2$. One way to measure thickness differences on the order of 50 angstroms is using a transmission electron microscope (TEM).

Integrated circuits built using gap filing methodologies according to embodiments of the invention also evidence significant and discernable differences as compared to integrated circuits built without gap filing methodologies according to embodiments of the invention when the same process is used. As known in the art, a given process is characterized by a given set of design rules that described the permitted sizes (overlaps and spacings). In the case of a process that supports standard transistors (e.g. 1.8 v; using a dielectric that is thin relative to the thickness of the thick gate dielectric) and high voltage transistors (e.g. 3.3v; using a thick gate dielectric), such design rules include a minimum spacing between thick gate dielectric regions in adjacent cells (shown as min $d_{TGOX}$ in FIG. 2) and the parameter shown as ds in FIG. 1 which represents the minimum thick gate dielectric overlap relative to the active transistor edge. Accordingly, if embodiments of the present invention are not used, the total distance between transistors on two adjacent row decap filler cells will be at least two times the minimum thick gate dielectric overlap of the transistor plus the minimum spacing between thick gate dielectric regions in adjacent cells. However, if embodiments of the invention are used with the same process (and same design rules), gap fill for the thick gate dielectric mask results in the total distance between transistors on two adjacent decap fillers (e.g. rows) being significantly less than two times the thick gate dielectric overlap of transistor plus the spacing between thick gate dielectric regions in adjacent cells, such as >10% less, >20% less in another embodiment, and >30% less in yet another embodiment. Accordingly, by analyzing a circuit, if the manufacturer (foundry) and process used are determined, then minimum total distance between transistors on two adjacent decap filler cells can be used to determined whether embodiments of the present invention were used.

Figure 6:
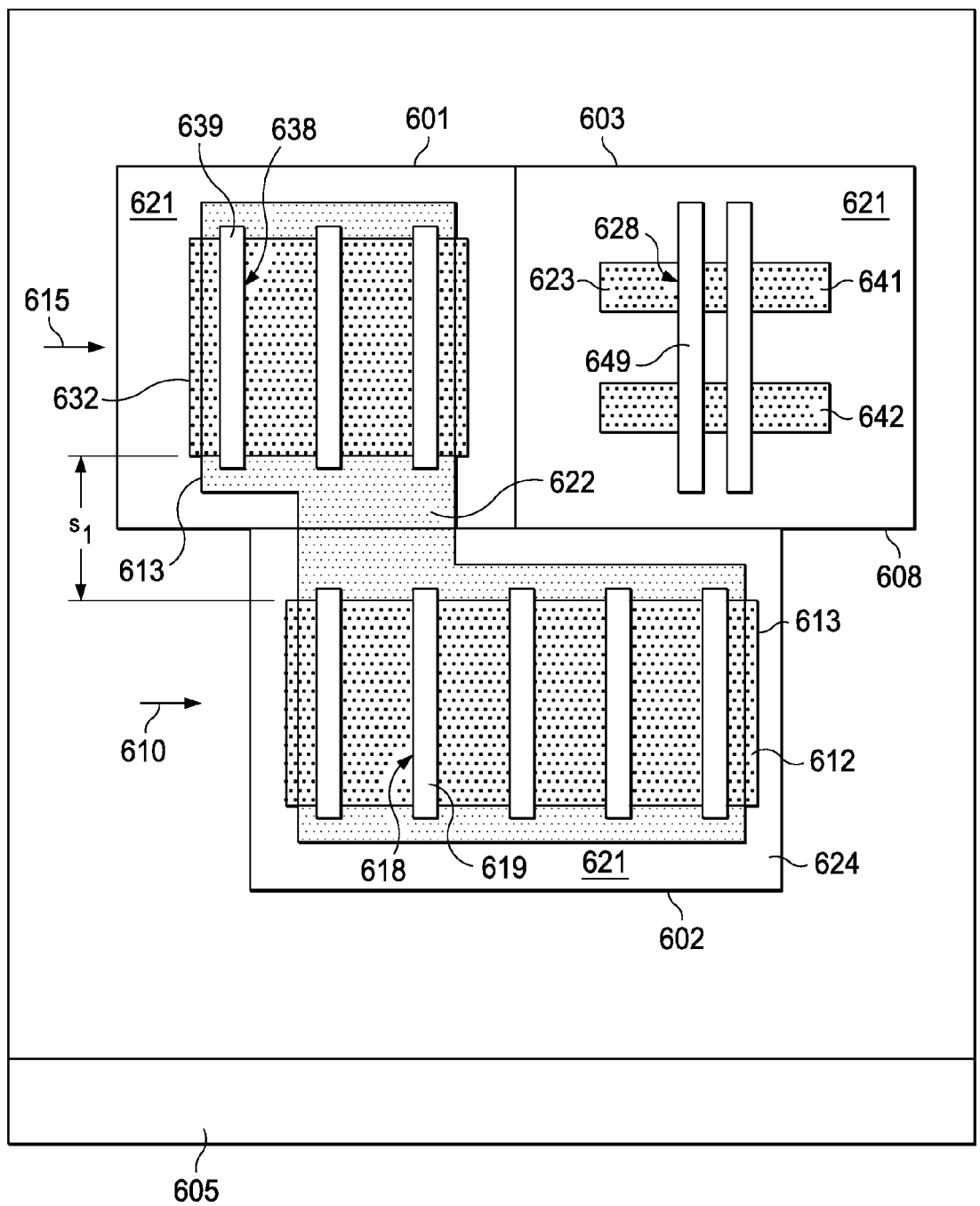
FIG. 6 shows a portion of integrated circuit based on a standard cell layout having high efficiency decap cells and a standard cell, according to an embodiment of the invention.

FIG. 6 shows a portion of integrated circuit 600 based on a standard cell layout having high efficiency decap cells 601, 602 and a standard cell 603 typically comprising logic or memory devices according to an embodiment of the invention. Cells 601 and 603 are in row 615, while cell 602 is in row 610 which is adjacent to (below) row 615. Integrated circuit 600 comprises a substrate 605 having a semiconducting surface. A border region 608 that would be recognized by one having skill in the art viewing the completed integrated circuit is shown between the respective cells. The active areas in cell 601 is shown as 632 and as 612 in cell 602, while cell 603 includes active areas 641 and 642 (e.g. p and n-type active areas).

The field dielectric has a full thickness region 621 and a thinned field dielectric region 622. The thinned field dielectric region 622 can be seen to extend continuously from the top active area edge in cell 602 continuously upwards through cell boundary 608 to the lower active area edge in cell 601. Thin field dielectric region is generally at least 50 angstroms thinner as compared to full thickness dielectric region 621, such as at least 100 angstroms thinner. The respective field dielectric regions 621 and 622 can comprise STI filed with a deposited silicon oxide. Decap cell 601 includes transistors 638 comprising gate electrode 639 on a relatively thick gate dielectric 613 (e.g. 15 to 30 Angstroms thick) formed in active area 632 (e.g. 30 to 90 Angstroms), while cell 602 includes transistors 618 comprising gate electrode 619 formed on a relatively thick gate dielectric 613 formed in active area 612. Cell 603 includes transistors 628 comprises gate electrode 649 on standard gate dielectric formed in active areas 641 and 642 of cell 603. Although not shown in FIG. 6, the respective transistors 638 and 618 in decap filler cells 601 and 602 are connected as decoupling capacitors (source and drains shown coupled together (e.g. by metal), such as shown in FIG. 1).

The total spacing distance between the top edge of active area 612 in cell 602 to the lower edge of active area 632 in cell 601 is shown as S1. As described above, embodiments of the invention reduce S1 for a given set of design rules to a distance less than two times the thick gate dielectric overlap of the transistors in cells 601 and 602 plus one times the spacing between thick gate dielectric regions in cells 601 and 606, such as >10% less, >20% less in another embodiment, and >30% less. Accordingly, the reduction in S1 allows active gate electrode regions for decap filler cells according to the invention to more closely approach the cell border 608 here in the vertical direction (cell top and bottom), thus providing an increase in cell capacitance and thus decap filler efficiency.

Transistors in cell 603 comprise thin gate dielectric 623 defined within active regions 641 and 642. In embodiments of the invention the total spacing (S1) shown between transistors in decap filler cells 601 and 602 can be defined by a maximum extension of an edge of the thick gate dielectric in cell 602 to reach a design rule minimum distance (S2) between the top edge of thick gate dielectric in cell 602 to a closest lower edge portion of the thin gate dielectric region defined by active area 612 (S2) is analogous to the distance shown in FIG. 2 as $d_{THINOX}$).

In the various embodiments of the present invention, an algorithm for implementing the methods described above can be implemented in a design tool including automatic error checking. Circuit design tools can include tools distributed by CADENCE™, SYNOPSYS™, MENTOR GRAPHICS™, MAGMA DESIGN AUTOMATION™, and others. Additionally, the altered or replacement decap cells can be modeled for inductance, resistance, capacitance and other electrical performance characteristics so that effects of the changes in the decap cells in the integrated circuit design can be modeled to determine their impact on circuit performance.

The design can be implemented in masks for contact, proximity, or projection photolithography processes. The masks can be designed to operate with any light source, including such as G-line, H-lines, the I-line resist processes. The masks can also be designed to be used with KrF and ArF laser resist processes. Furthermore, the masks can be designed to operate with DUV (deep ultraviolet), EUV (extreme ultraviolet), and X-ray resist processes.

The integrated structure can include various elements therein and/or layers thereon. These can include metal or other interconnect layers, barrier layers, dielectric layers, device structures, active elements and passive elements including word lines, source regions, drain regions, bit lines, bases, emitters, collectors, conductive lines, conductive vias, etc. Moreover, instead of using the invention on a CMOS structure as described above, the invention is applicable to other semiconductor technologies such as BiCMOS, bipolar, SOI, strained silicon, pyroelectric sensors, opto-electronic devices, microelectrical mechanical system (MEMS), or SiGe.

While this invention has been described according to some exemplary embodiments, it contemplated that still other modifications of, and alternatives to, these embodiments, such modifications and alternatives obtaining the advantages and benefits of this invention, will be apparent to those of ordinary skill in the art having reference to this specification and its drawings.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of standard cell design of an integrated circuit comprising a substrate having a semiconducting surface, a plurality of standard cells arranged in a plurality of rows comprising at least a first row and a second row immediately above said first row, said first row comprising at least a first of said standard cells, said first standard cell comprising a first decap filler cell comprising at least a first MOS transistors having a gate electrode on a thick gate dielectric on said surface connected as a decoupling capacitor, said second row comprising at least a second of said standard cells, said second standard cell comprising a second decap filler cell comprising at least a second MOS transistors having a gate electrode on said thick gate dielectric on said surface connected as a decoupling capacitor, comprising:

placing a plurality of circuit elements including said plurality of standard cells comprising a plurality of standard cell gates in a circuit layout for said integrated circuit and placing a plurality of decap filler cells including said first and second decap filler dells in at least some locations in said integrated circuit unused by said standard cell gates using design rules including a first minimum spacing between thick gate dielectric mask regions for adjacent cells;

expanding at least one dimension of said thick gate dielectric mask for said plurality of decap filler cells to cause a violation of said first minimum spacing between said first and second decap filler cells, and placing a gap fill portion to add a thick gate dielectric mask portion across a border between said first and second decap filler cells to remove said violation.

2. The method of claim 1, wherein said placing a gap fill portion comprises:

taking said thick gate dielectric mask regions together, incrementing said thick gate dielectric mask regions so that regions with said violation touch or overlap, merging said regions which touch or overlap, and decrementing said thick gate dielectric mask in size by the same amount in said incrementing step.

3. The method of claim 1, wherein said placing a gap fill portion comprises:

for only said decap filler cells, taking geometries of said thick gate dielectric mask regions from all said decap filler cells, sorting said decap filler cells into rows and sorting each of said rows in ascending or descending dimension along said rows, determining an overlap region along adjacent ones of said rows, and adding thick gate dielectric mask rectangles in said overlap region.

4. The method of claim 3, wherein said determining comprises analyzing a placement of said decap filler cells to determine spacings of their respective thick gate dielectric mask regions with regard to horizontal and vertical edges of said decap filler cells.

5. The method of claim 1, wherein said expanding comprises expanding said thick gate dielectric mask towards a top and bottom of said decap filler cells until it just satisfies a design rule for said integrated circuit comprising a second minimum spacing between said thick dielectric mask edge and an adjacent thin dielectric mask edge.

6. The method of claim 1, further comprising the step of identifying and eliminating corner overlap violations that exist in said thick gate dielectric for said decap filler cells before said placing step.

7. The method of claim 6, wherein said eliminating violations comprises reducing a drawn size of at least one of said decap filler cells which cause said corner overlap violation.

8. The method of claim 7, wherein said reducing comprises a reduction in increments of a placement grid (PG) distance.

9. The method of claim 1, further comprising the steps of:

expanding at least one dimension of an nwell or pwell mask associated with said decap filler cells, and placing a gap fill portion to add nwell or pwell mask portions to remove nwell or pwell minimum spacing violations.

10. The method of claim 1, wherein an automatic algorithm is used for implementing said method in a design tool including automatic error checking.

* * * * *